(12) United States Patent
Roland et al.

(10) Patent No.: US 8,030,922 B2
(45) Date of Patent: Oct. 4, 2011

(54) MAGNETIC RESONANCE TOMOGRAPHY METHOD AND APPARATUS FOR CORRECTING DRIFT OF THE B0 FIELD IN A TEMPERATURE MAP

(75) Inventors: Joerg Roland, Hemhofen (DE); Florian Steinmeyer, Herzogenaurach (DE); Michael Zwanger, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 356 days.

(21) Appl. No.: 12/407,091

(22) Filed: Mar. 19, 2009

(65) Prior Publication Data
US 2009/0238429 A1  Sep. 24, 2009

(30) Foreign Application Priority Data
Mar. 19, 2008  (DE) .......................... 10 2008 014 928

(51) Int. Cl.
*G01V 3/00* (2006.01)
(52) U.S. Cl. ....................................... 324/309; 324/312
(58) Field of Classification Search .......... 324/300–322; 600/407–445
See application file for complete search history.

(56) References Cited

U.S. PATENT DOCUMENTS

| | | | |
|---|---|---|---|
| 6,064,206 A * | 5/2000 | Van Vaals et al. | 324/312 |
| 6,073,041 A | 6/2000 | Hu et al. | |
| 6,759,848 B2 * | 7/2004 | Kruger | 324/318 |
| 7,359,745 B2 * | 4/2008 | Lewin et al. | 600/410 |
| 7,505,805 B2 * | 3/2009 | Kuroda | 600/410 |
| 7,772,846 B2 * | 8/2010 | Roland | 324/309 |
| 2003/0214297 A1 | 11/2003 | Kruger | |
| 2007/0055140 A1 * | 3/2007 | Kuroda | 600/423 |
| 2011/0046475 A1 * | 2/2011 | Assif et al. | 600/422 |

OTHER PUBLICATIONS

"Study of Temporal Stationarity and Spatial Consistency of fMRI Noise Using Independent Component Analysis," IEEE Trans. On Medical Imaging, vol. 24, No. 6 (2005) pp. 712-718.

* cited by examiner

*Primary Examiner* — Brij B Shrivastav
(74) *Attorney, Agent, or Firm* — Schiff Hardin LLP

(57) ABSTRACT

In a method and device for correction of a B0 field drift in a temperature map acquisition by magnetic resonance tomography, a fluctuation measurement is calculated per pixel from a number of magnetic resonance tomography phase images of an examination subject or from temperature maps derived therefrom. Using this fluctuation measurement, pixels of the phase images or temperature maps with low fluctuation are determined, and corresponding pixels of a phase image to be corrected or of a temperature map to be corrected are selected using the pixels determined as having low fluctuation. The phase image to be corrected or the temperature map to be corrected is adjusted to a reference phase image or a reference temperature map such that the selected pixels of the phase image to be corrected or of the temperature map to be corrected are calibrated to corresponding pixels of the reference phase image or of the reference temperature map.

9 Claims, 2 Drawing Sheets

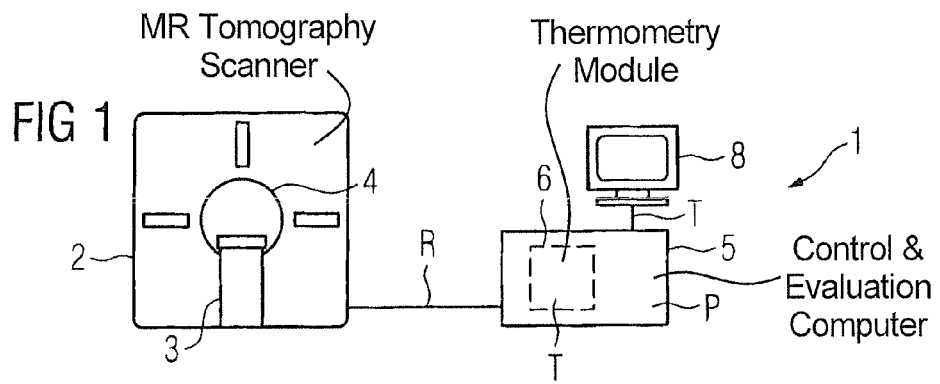
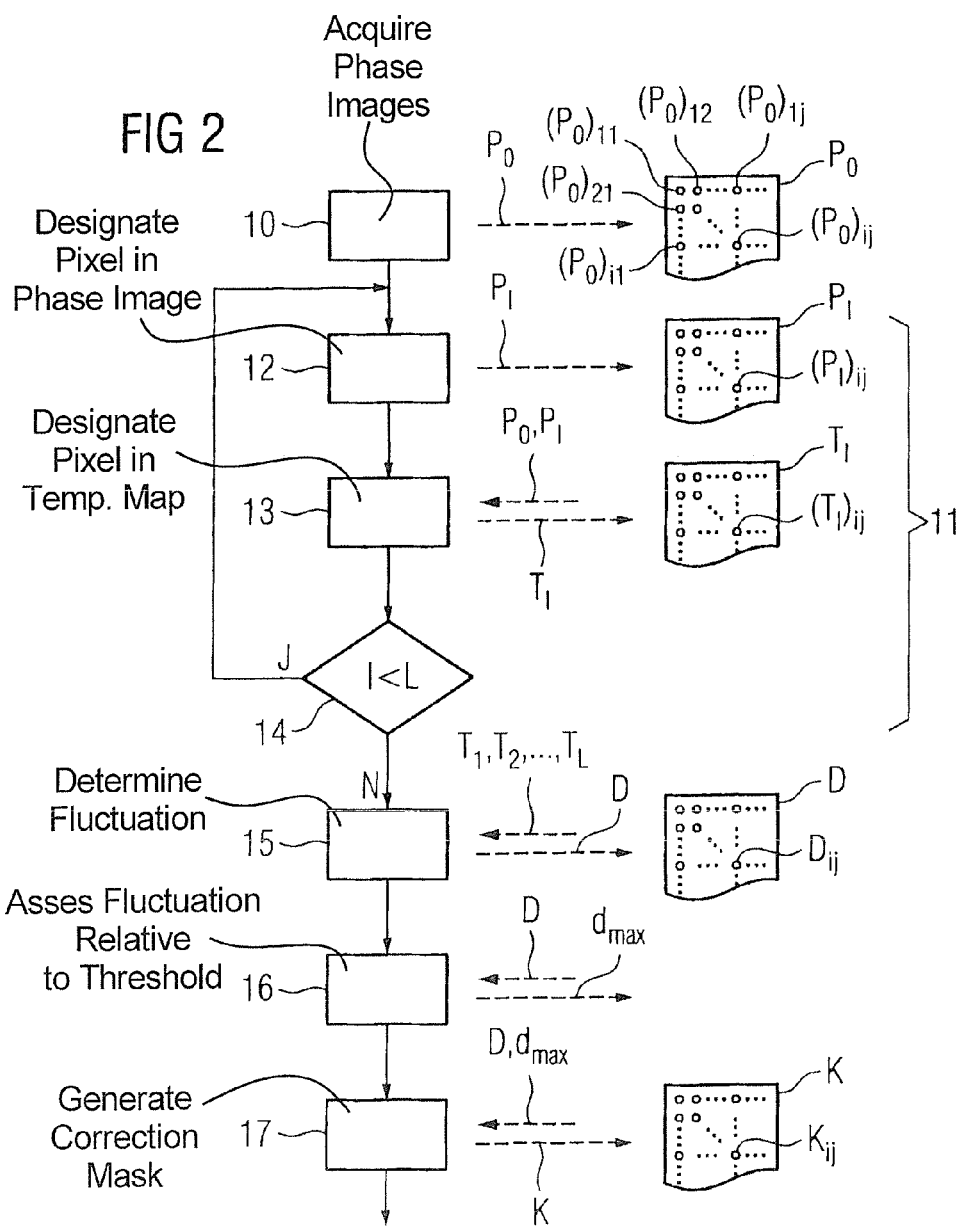

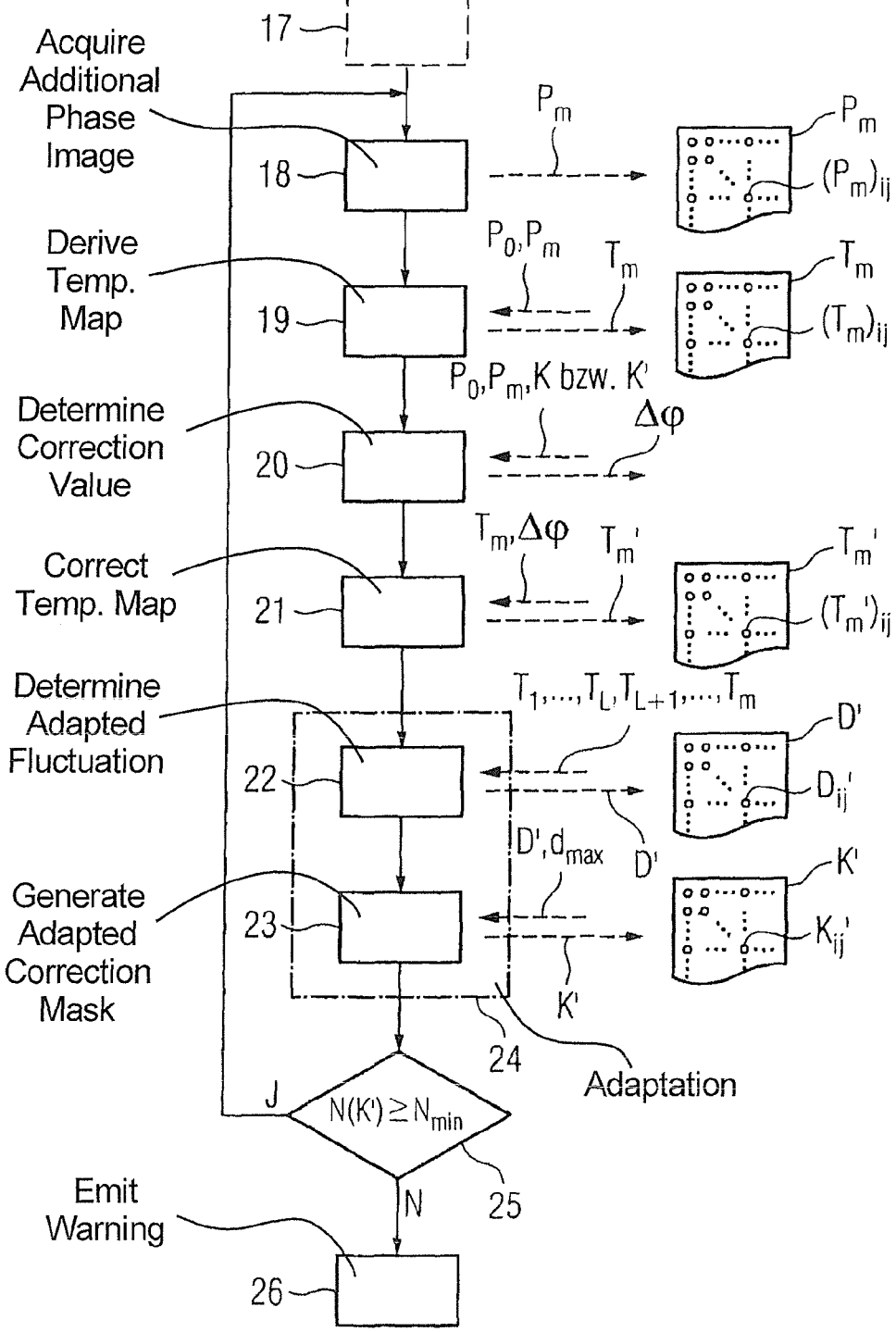

MAGNETIC RESONANCE TOMOGRAPHY METHOD AND APPARATUS FOR CORRECTING DRIFT OF THE B0 FIELD IN A TEMPERATURE MAP

BACKGROUND OF THE INVENTION

1. Field of the Invention

The present invention concerns a method for correction of B0 field drift in a temperature map exposure by means of magnetic resonance tomography. The invention furthermore concerns a device to implement such a method.

2. Description of the Prior Art

An image representation of an examination subject—in particular the body of a patient—that graphically reproduces the spatial distribution of the temperature or of a temperature difference within the examination subject is designated as a temperature map. Such a temperature map can be acquired by means of a magnetic resonance (MR) tomography apparatus scanner.

The presentation of temperature maps that show the time change of the temperature distribution within a patient body is useful in the context of tumor ablation in interventional radiology. The tumor tissue to be removed is heated (and thus killed) non-invasively by the application of focused ultrasound or by the application of laser light or radio waves by means of a probe inserted into the patient's body.

In order to be able to continuously monitor the temperature in the patient body during such a procedure (more precisely, in the region of the tissue to be ablated), the procedure typically occurs either directly in an MR scanner or in immediate proximity thereto. The temperature monitoring ensues by generating temperature maps of the patient's body continuously or at regular intervals over a longer time span, typically 30 to 120 minutes.

The nuclear magnetic resonance frequency of hydrogen atoms (protons) in a water molecule (and thus in particular in the water molecules of the patient's body) exhibit a characteristic temperature dependency. This physical effect is typically utilized for non-invasive temperature determination by means of magnetic resonance tomography. As a result of this temperature dependency, temperature differences in the patient's body are manifested by a spatial variation of the phase of the magnetic resonance signal, that is represented in the form of complex numbers. Information about the temperature distribution in the patient body at the point in time of acquisition therefore can be obtained from an image known as a phase image, that reproduces this phase with spatial resolution.

Phase images that were acquired at the points in time to be compared are typically subtracted pixel-by-pixel from one another to determine the (spatially resolved) temperature difference in the patient body between different acquisition points in time. In interventional radiology, in particular a "heated" phase image (therefore a phase image acquired at a point in time during the procedure) is subtracted from an "unheated" phase image (i.e. a phase image acquired before the beginning of the procedure). The temperature difference between the two acquisition points in time is then calculated from the resulting difference image for each pixel. The generation of temperature maps by means of MR tomography is designated as (MR) thermometry.

The precision of a temperature map generated in such a manner, in particular the precision with which the temperature difference between two acquisition points in time at a specific location of the patient body can be determined from such a temperature map, is typically impaired by the B0 field drift. The B0 field drift is a slow variation of the basic magnetic field (B0 field) of the MR scanner that is used to generate the temperature map.

Variation of the B0 field also disadvantageously leads to a change of the proton resonance frequency to which the acquisition of a temperature map is tied (in terms of measurement). Like temperature changes in the patient body, variations of the B0 field thus directly affect the phase images, but temperature-dependent phase changes and B0 field-dependent phase changes cannot be differentiated from each other without additional measures. An error in the resulting temperature map that normally grows with increasing distance between the acquisition points in time thus arises due to the B0 field drift.

To correct the influence of the B0 field drift in temperature maps, it has previously been typical to identify spatial regions of the phase images to be compared—in which spatial regions no temperature change is to be expected between the acquisition points in time—and to use such regions as correction regions.

For B0 field drift correction, the correction regions in the phase images to be compared are calibrated to one another. In other words, one of the phase images (normally the phase image acquired later) to be compared is corrected such that the correction region of the corrected phase image coincides with the correction region of the other comparison image with regard to the phase values, so a temperature difference of zero results.

To produce such a correction region, usually a magnetic resonance phantom filled with water at room temperature is placed in the examination volume while each phase image is being acquired. Alternatively, a region of the patient's body in which no heating or cooling between the acquisition points in time is expected can be defined as a correction region. The correction regions are to be manually defined by the user in any case.

Both known methods for correction of the influence of the B0 field drift are relatively error-prone. In particular, displacement of the phantom or (if the correction region was defined in the patient's body) a change of the patient position between the acquisition points in time can lead to a greater error of the resulting temperature map as a resulting of incorrect B0 drift correction.

An error of the B0 drift correction can also result from the fact that an unintended temperature change nevertheless occurs in the correction region between the acquisition points in time. Such errors in particular occur when the correction region is selected in the patient's body.

SUMMARY OF THE INVENTION

An object of the present invention is to provide a method for correction of the B0 field drift that is simple to implement and foolproof for a temperature map acquisition by means of magnetic resonance tomography. A further object of the invention is to provide a device that is particularly suitable to implement the method.

This object is achieved according to the invention by a method wherein a fluctuation measurement is calculated per pixel from a number of magnetic resonance tomography phase images of an examination subject or from temperature maps derived therefrom. Such a "per pixel" calculation means that the individual pixels of the respective phase images or the respective temperature maps that correspond to one another with regard to the pixel coordinates are considered separately from pixels of other coordinates. A "fluctuation measurement" means arbitrary quantity that contains information about the fluctuation of the pixel values at the respective pixel coordinates, such information allowing a determination to be made as to how significantly the pixels corresponding to one another with regard to their pixel coordinates deviate from one another with regard to their value of this quantity.

Pixels of the phase images or temperature maps with low fluctuation are subsequently identified using the fluctuation measurement. The pixels (more precisely their pixel coordinates) detected as having low fluctuation are preferably marked in a correction mask. The selection of the pixels having low fluctuation is preferably conducted using a comparison of the fluctuation measurement with a threshold. Depending on the definition of the fluctuation measurement (i.e. the quantity that is employed to represent the fluctuation), pixels are selected as exhibiting fluctuation when the associated fluctuation measurement falls short of or exceeds the threshold.

Using the pixels identified as having low fluctuation, pixels in a phase image to be corrected or in a temperature map to be corrected are selected in a subsequent step as forming the correction region for the B0 drift correction to be conducted. The phase image to be corrected or the temperature map to be corrected is adapted in the course of this correction to a reference phase image or a reference temperature map. This is done by the pixels of the phase image to be corrected, or the pixels of the temperature map to be corrected, that are selected as the correction region, are calibrated to corresponding (with regard to the image coordinates) pixels of the reference phase image or corresponding pixels of the reference temperature map. This calibration can ensue per pixel so that, in the phase image to be corrected or in the temperature map to be corrected, each of the pixels in the selected correction range exhibits exactly the same value after the adaptation as the corresponding pixel of the reference phase image or of the reference temperature map. The pixels contained in the selected correction region of the phase image to be corrected or the temperature map to be corrected are preferably fitted to a mean value of the corresponding pixels of the reference phase image or of the reference temperature map. The method is advantageously conducted in a fully automated manner.

The invention is based on the recognition that the drift of the B0 field takes place on a comparably long time scale, such that the value change of the pixels that is caused by the B0 field drift is normally significantly smaller (at least on short time scales) than the changes caused by temperature changes, subject movements and other influencing variables. In other words, changes between corresponding pixels of different phase images or different temperature maps that are subjected exclusively to the B0 field drift are significantly less than changes between corresponding pixels that are affected by a temperature change and/or by subject movement. The selection of the correction region is thereby significantly simplified. In particular, neither expertise nor experience with temperature-stable regions inside and outside of the patient body are required for the method according to the invention. Moreover, the method according to the invention is particularly foolproof. Both image regions that are affected by movement artifacts and image regions in which a temperature change occurs can be detected with certainty using the pixel fluctuations associated therewith, and can be excluded from inclusion in the correction region. In particular the automated implementation of the method is significantly facilitated.

In a simple and appropriate embodiment of the method, the standard deviation from one another for respective pixels at corresponding image coordinates of the different phase images or different temperature maps is advantageously determined as the fluctuation measurement.

In a more elaborate but more precise variant of the method, the time curve of the B0 field drift is determined during the acquisition of the phase images and is taken into account in the calculation of the fluctuation measurement. In particular the mean square deviation of pixels that correspond to one another in the phase images or in the temperature maps relative to the time curve of the B0 field drift, or relative to a trend line modeled thereon, is used as the fluctuation measurement.

The threshold required to determine the correction mask is preferably established at the beginning of the method according to the requirement that a predetermined percentile of the pixels be marked as pixels with low fluctuation. A statistical stability of the correction method that is essentially independent of the image quality is thereby achieved.

In an embodiment of the method, a first correction mask is initially generated in the manner described above in an initial method phase using a predetermined number of phase images or temperature maps. This first or original correction mask is continuously adapted in the further course of the method. For this purpose, an adapted fluctuation measurement is determined per pixel using phase images or temperature maps generated later and is used to adapt the correction mask. The adaptation of the correction mask can ensue by pixels of the original correction mask that are selected as having low fluctuation being discarded at a later point in time when the fluctuation measurement associated with these pixels rises above the threshold (or falls below the threshold) at this later point in time. Optionally, pixels of the correction mask that were not initially selected as having low fluctuation may be selected at a later point in time when the associated fluctuation measurement at this lower point in time falls below the threshold (or rises above the threshold). In particular, subject movements that ensue after the initial generation of the correction mask are detected with certainty through the continuous adaptation of the correction mask since, in the case of a subject movement, a significant value change abruptly occurs with high probability at a large number of pixel coordinates. Moreover, possible temperature changes in the original pixel region selected as a correction region are also detected, and those pixel regions that have become uncertain are "cut out" of the correction region.

To increase the operating safety of the method, preferably a warning signal is output if the number of pixels marked in the adapted correction mask falls below a predetermined minimum number.

In another embodiment, the actual drift correction is conducted by adapting the phase image to be corrected or the temperature map to be corrected to a reference phase image or a reference temperature map by causing the mean value of the selected pixels of the phase image to be corrected or of the temperature map to be corrected to correspond to the mean value of the corresponding pixels of the reference phase image or of the reference temperature map.

The above object also is achieved according to the invention by device having a thermometry module configured in terms of circuitry and/or programming to implement the method described above. The thermometry module can be a software module that is embodied in an associated data processing system. The thermometry module is in this case a component of evaluation software of an MR tomography apparatus. As an alternative, the thermometry module can be entirely or partially realized as separate hardware components.

BRIEF DESCRIPTION OF THE DRAWINGS

FIG. 1 shows a medical device with an MR tomography scanner and an associated control and evaluation computer that implements evaluation software with a thermometry module for temperature map generation with correction of a possible B0 field drift, in accordance with the invention.

FIG. 2 is a flowchart of a first part of an embodiment of a method implemented by the thermometry module.

FIG. 3 is a flowchart of a second part of the method according to FIG. 2.

DESCRIPTION OF THE PREFERRED EMBODIMENTS

The device 1 shown in FIG. 1 has a schematically shown magnetic resonance (MR) tomography scanner 2 with a schematically indicated patient table 3 on which a patient (not shown) can be borne and positioned in a tube 4 of the MR tomography scanner 2 for data acquisition by means of magnetic resonance tomography.

The device 1 furthermore has a control and evaluation computer 5 that implements software to control the MR tomography scanner 2 as well as software to evaluate the data generated by the MR tomography scanner 2. This evaluation software includes a thermometry module 6 to generate temperature maps T of the patient. The thermometry module 6 is configured to correct (in a manner described in detail in the following) the influence of a possible drift of the B0 field in the MR tomography scanner 2 on the generated temperature maps T.

The device 1 furthermore has means for data input and output that are connected with the computer 5, in particular a screen 8 schematically represented in FIG. 1.

In the operation of the device 1, the MR tomography scanner 2 generates magnetic resonance tomography raw data R that essentially represent a response signal of the body tissue of the patient to nuclear magnetic resonance excitation generated by the MR tomography scanner 2. From the raw data R, a reconstruction module (not shown in detail), implemented in software in the computer 5, generates (among other things) phase images P in which the phase of the magnetic resonance signal (present in the form of mathematically complex numbers) is recorded (plotted) with spatial resolution. On the basis of such phase images P, the thermometry module 6 generates the temperature maps T in which a measurement for a temperature distribution in the patient body and/or the change of such a temperature distribution in comparison to a reference point in time is rendered with spatial resolution. These temperature maps T can be displayed on the screen 8.

The acquisition of temperature maps T by the device 1 can ensue in connection with at thermoablation treatment of the patient in which pathological tissue inside the body is killed by localized overheating. Temperature maps T of the patient are generated at regular time intervals to monitor this treatment. Using these temperature maps T the temperature development in the patient's body or the treated region is monitored.

The method for generation of temperature maps T that is implemented by the thermometry module 6 is presented in detail in FIGS. 2 and 3.

According to FIG. 2, in a first Step 10 of the method the thermometry module 6 initially prompts the acquisition of a reference phase image $P_0$. As schematically indicated in FIG. 2, the reference phase image $P_0$ contains a matrix (here only a two-dimensional example) of pixels $(P_0)_{ij}$ with i=1, 2, ..., I and j=1, 2, ..., J. The value of the phase of the magnetic resonance signal at the location of the pixel $(P_0)_{ij}$ is associated as an image value with each pixel $(P_0)_{ij}$.

Given application of the method in the scope of a thermoablation treatment, the reference phase image $P_0$ is acquired before the beginning of the treatment and thus shows the unheated state of the patient body.

In an initial phase 11 of the method, the thermometry module 6 prompts the acquisition of a predetermined number of L (for example L=10) phase images $P_I$ at regular time intervals, with I=1, 2, ..., L, and derives corresponding temperature maps $T_I$ therefrom.

The difference between the phase image $P_I$ and the reference phase image $P_0$ is calculated per pixel in a subsequent Step 13 after the acquisition of the associated phase image $P_I$ (Step 12) to generate each temperature map $T_I$:

$$(T_I)_{ij} = (P_I)_{ij} - (P_0)_{ij} \qquad \text{EQ 1}$$

The variables $(P_I)_{ij}$ and $(T_I)_{ij}$ in turn respectively designate a pixel of the phase image $P_I$ or of the temperature map $T_I$. Steps 12 and 13 are repeated according to the requirements of the condition I<L (polled in a subsequent Step 14) until the predetermined number L of phase images $P_I$ or temperature maps $T_I$ are acquired.

During the initial phase 11 of the method that is formed by Steps 12 through 14, a correction of the B0 field drift in the phase images $P_I$ or temperature maps $T_I$ has not yet been conducted. Rather, the phase images $P_I$ and temperature maps $T_I$ acquired during the initial phase 11 are used as initial data using which the correction region used for the subsequent B0 field drift is selected.

To select the correction region, for each pixel coordinate ij of the temperature maps $T_I$ the fluctuation of the phase values associated with these pixel coordinates ij is initially determined in Step 15 in the further course of the method. The standard deviation is used as a measure of fluctuation:

$$D_{ij} = std[(T_1)_{ij}; 1 = 1, 2, \ldots, L] \qquad \text{EQ 2}$$

$$= \left( \frac{1}{L-1} \cdot \sum_{l=1}^{L} ((T_1)_{ij} - \overline{(T_1)_{ij}})^2 \right)^{\frac{1}{2}},$$

wherein $$\overline{(T_1)_{ij}} = \frac{1}{L} \cdot \sum_{l=1}^{L} ((T_1)_{ij}) \qquad \text{EQ 3}$$

designates the mean value of the pixels $(T_i)_{ij}$ through $(T_L)_{ij}$ that is calculated per pixel.

A fluctuation matrix D is generated as a result in Step 15. This fluctuation matrix D contains a corresponding fluctuation value $D_{ij}$ for each pixel coordinate ij of the temperature maps $T_I$.

Using the fluctuation matrix D, a fluctuation threshold $d_{max}$ is determined in a subsequent Step 16 such that a specific percentile of the fluctuation values $D_{ij}$ contained in the fluctuation matrix D (for example 10% of the fluctuation values $D_{ij}$) fall below this threshold $d_{max}$.

Step 16 can be formulated as follows in Matlab program code, for example:

D_sort=sort(D(:));

d_max=D_sort(round(0,1*size(D_sort)));

In the above program example, D_sort designates a vector that contains the fluctuation values $D_{ij}$ sorted according to size.

Using the fluctuation matrix D and the threshold $d_{max}$, in a following Step 17 a correction mask K is generated in which all pixel coordinates ij of the temperature maps $T_I$ with low fluctuation are marked. The correction mask K is a matrix with a number of elements $K_{ij}$ corresponding to the number of pixels $(T_I)_{ij}$, wherein each of these elements $K_{ij}$ has a value of 1 when the values of the associated pixels $(T_I)_{ij}$ have low fluctuation in comparison to the threshold $d_{max}$, or has a value of 0 when the associated pixels $(T_I)_{ij}$ exhibit a high fluctuation:

$$K_{ij} = \begin{cases} 1 & \text{if } D_{ij} \leq d_{max} \\ 0 & \text{otherwise} \end{cases} \qquad \text{EQ 4}$$

The correction mask K generated in Step 17 is used in the further method workflow presented in FIG. 3 to correct the B0 field drift in additional phase images $P_m$ (m=L+1, L+2, ...) or corresponding temperature maps $T_m$.

For this purpose, one of the additional phase images $P_m$ is initially acquired (Step 18), analogous to Steps 12 and 13, and from this an associated temperature map $T_m$ is derived (Step 19) according to $$(T_m)_{ij}=(P_m)_{ij}-(P_0)_{ij}. \qquad \text{EQ 5}$$

The variables $(P_m)_{ij}$ and $(T_m)_{ij}$ in turn designate pixels of the phase image $P_m$ or of the temperature map $T_m$ at the pixel coordinate ij.

In a subsequent Step 20, a correction value $\Delta\phi$ that reflects the magnitude of the B0 field drift between the acquisition points in time of the reference phase image $P_0$ and the phase image $P_m$ to be corrected is determined by comparison of the phase images $P_m$ and $P_0$. The correction value $\Delta\phi$ hereby corresponds to the difference of the average phase value of the pixels $(P_0)_{ij}$ or of the pixels $(P_m)_{ij}$. Only those pixels $(P_0)_{ij}$ and $(P_m)_{ij}$ that are marked as having low fluctuation ($K_{ij}$=1) according to the specification of their image coordinates ij in the correction mask K are considered in the averaging:

$$\Delta\varphi = \frac{\sum_{i,j} K_{ij}((P_m)_{ij}-(P_0)_{ij})}{\sum_{i,j} K_{ij}} \qquad \text{EQ 6}$$

Using a correction factor determined in such a manner, in a following Step 21 the temperature map $T_I$ is corrected by the influence of the B0 drift in that the correction value $\Delta\phi$ is subtracted from the phase value of each pixel $(T_m)_{ij}$ of the temperature map $T_m$ to be corrected:

$$(T_I')_{ij}=(T_I)_{ij}-\Delta\phi \qquad \text{EQ 7}$$

According to EQ 7, an adapted temperature map $T_I'$ with pixels $(T_I')_{ij}$ is generated as a result of this B0 field drift.

In subsequent Steps 22 and 23, a concluding adaptation 24 of the correction mask K is conducted. For this an adapted fluctuation matrix D' with fluctuation values $D_{ij}'$ is generated in Step 22 under consideration of the previously acquired temperature maps $T_n$ (n=1, 2, ..., L, L+1, ..., M) (analogous to Step 15) according to $$D'_{ij}=\text{std}\lfloor (T_n)_{ij}; n=1, 2, \ldots, L, L+1, \ldots, m \rfloor. \qquad \text{EQ 8}$$

The standard deviation std [] in EQ 8 is thereby defined analogous to EQ 2 and 3. In Step 23 an adapted correction mask K' with elements $K_{ij}'$ is then generated according to $$K_{ij}' = \begin{cases} 1 & \text{if } K_{ij} = 1 \cap D_{ij}' \leq d_{max} \\ 0 & \text{otherwise} \end{cases} \qquad \text{EQ 9}$$

using this adapted fluctuation matrix D' and the threshold $d_{max}$ defined in Step 16, wherein the operator ⊓ stands for the logical AND conjunction. In the adapted correction mask K', all elements $K_{ij}'$ with $K_{ij}$=1 for which the associated fluctuation value exceeds the threshold $d_{max}$ are thus set to a value of 0 according to EQ 9. Graphically speaking, all original pixels that are marked as having low fluctuation and whose associated fluctuation measure has in the meanwhile exceeded the threshold $d_{max}$ are deleted from the adapted correction mask K'.

In Step 25 it is subsequently checked whether the number N(K') of the pixels marked in the adapted correction mask K', i.e. the number of the elements $K_{ij}'$ with a value of 1 exceeds a predetermined minimum number $N_{min}$:

$$N(K') = \sum_{i,j} K_{ij}' \geq N_{min} \qquad \text{EQ 10}$$

The minimum number $N_{min}$ can be set to a percentile of the total number of the elements $K_{ij}'$ of the adapted correction mask K', in particular to 1% of this number. If EQ 10 is satisfied (Y), after a predetermined wait time (for example of 3 seconds) Steps 18 through 23 are executed again, and the next temperature map $T_m'$ is thus acquired.

In the second and every additional pass-through of Steps 18 through 23, the adapted correction mask K' is used as an input variable for Step 20 instead of the original correction mask K.

If EQ 10 is not satisfied (N), in Step 26 a warning message is generated (for example in the form of a warning tone) and the method implementation is terminated.

In a variant of the method described in the preceding, not all previously acquired temperature maps $T_I$ through $T_m$ are taken into account in the calculation of the standard deviation in Step 22, but only a predetermined selection of these temperature maps. For example, upon reaching a certain number of temperature maps (for example m<50), only every additional fifth temperature map $T_I$ or $T_m$ is considered. As an alternative to this, it can be provided that the standard deviation is calculated over a sliding window that, for example, encompasses the last twenty acquired temperature maps $T_{m-19}, T_{m-18}, \ldots, T_m$.

In another embodiment of the method described in the preceding, the mean square deviation of the phase value of the pixels $(T_I)_{ij}$ or $(T_n)_{ij}$ at the coordinate ij of a trend line modeled on the time curve of the correction value $\Delta\phi$ is used in Steps 15 and/or 22 instead of the standard deviation. The trend line is defined by linear regression of the time curve of the correction value $\Delta\phi$, for example.

In the scope of the method, the future curve of the drift can optionally be extrapolated from the knowledge of the previous time curve of the B0 field drift, and in particular can be proactively accounted for in the acquisition of the next temperature map $T_m$.

Additionally or as an alternative to this, it is within the scope of the method to separately calculate the B0 field drift (thus in particular the correction value $\Delta\phi$) for different spatial regions of the temperature maps $T_I$ or $T_m$. For example, for this purpose the correction value $\Delta\phi$ can be calculated separately for each of three image sectors. Spatial interpolation or extrapolation can then be conducted between these interpolation values of the correction value Δφ. In the event that these three interpolation values are not collinearly selected, a spatial function of the field drift in the form of a plane stretched over the image surface can be calculated using these three interpolation values, in particular by interpolation or extrapolation.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for correcting B0 field drift in a temperature map generated by magnetic resonance tomography, comprising the steps of:
    generating a plurality of body temperature distribution representations, each of the same region of an examination subject by magnetic resonance tomography using a magnetic resonance tomography data acquisition unit having a B0 field that is subject to B0 field drift, each of said body temperature distribution representations being comprised of a plurality of pixels, and said body temperature distribution representations being selected from the group consisting of magnetic resonance phase images and temperature maps respectively derived from magnetic resonance phase images;
    for each pixel in each of said body temperature distribution representations, automatically electronically calculating a fluctuation measurement;
    for pixels in corresponding positions in respective body temperature distribution representations in said plurality of body temperature distribution representations, automatically identifying pixels exhibiting a low fluctuation that is characteristic of resulting from said B0 field drift;
    using only said pixels exhibiting said low fluctuation, generating a body temperature distribution reference representation, selected from the group consisting of a reference phase image and a reference temperature map; and
    correcting at least one of said body temperature distribution representations, or a subsequently-acquired body temperature distribution representation, as a body temperature distribution representation to be corrected, by calibrating respective pixels in said body temperature distribution representation to be corrected with respective pixels corresponding in position in said body temperature distribution reference representation.

2. A method as claimed in claim 1 comprising calculating said flex measurement by calculating the standard deviation of pixels in corresponding positions in said multiple body temperature distribution representations.

3. A method as claimed in claim 2 comprising calculating a time curve of said B0 field drift, and calculating said fluctuation measurement using said time curve.

4. A method as claimed in claim 1 comprising identifying said pixels exhibiting said low fluctuation by comparing the fluctuation measurement for each pixel to a threshold, and defining said threshold as a predetermined percentile of pixels in each body temperature distribution representation that are statistically expected to exhibit said low fluctuation.

5. A method as claimed in claim 1 comprising generating a correction mask using only said pixels exhibiting said low fluctuation, and using said mask to calibrate said pixels in said body temperature distribution representation to be corrected.

6. A method as claimed in claim 5 wherein said correction mask is an initial correction mask, and comprising:
    after correcting said body temperature distribution representation to be corrected using said initial correction mask, obtaining a subsequently-generated body temperature distribution representation selected from the group consisting of a subsequently-acquired phase image and a subsequently-derived temperature map derived from said subsequently-acquired phase image;
    automatically calculating a fluctuation measurement for said subsequently-generated body temperature distribution representation;
    generating an adapted correction mask using said fluctuation measurement from said subsequently-generated body temperature distribution representation; and
    correcting said subsequently-generated body temperature distribution representation for said B0 field drift using said adapted correction mask.

7. A method as claimed in claim 6 comprising automatically emitting a humanly-perceptible warning if a number of pixels exist in said adapted correction mask that exhibits said low fluctuation is below a predetermined minimum number.

8. A method as claimed in claim 1 comprising calibrating said body temperature distribution representation with respect to said body temperature distribution reference representation by adapting said body temperature distribution representation to be corrected to said body temperature distribution reference representation to cause a mean value of pixels in said body temperature distribution representation to be corrected to correspond to a mean value of corresponding pixels in said body temperature distribution reference representation.

9. An apparatus for correcting B0 field drift in a temperature map generated by magnetic resonance tomography, comprising:
    a magnetic resonance data acquisition unit configured to generate a plurality of body temperature distribution representations, each of the same region of an examination subject by magnetic resonance tomography, said magnetic resonance tomography data acquisition unit having a B0 field that is subject to B0 field drift, each of said body temperature distribution representations being comprised of a plurality of pixels, and said body temperature distribution representations being selected from the group consisting of magnetic resonance phase images and temperature maps respectively derived from magnetic resonance phase images;
    a processor configured to automatically calculate, for each pixel in each of said body temperature distribution representations, a fluctuation measurement;
    for pixels in corresponding positions in respective body temperature distribution representations in said plurality of body temperature distribution representations, said processor being configured to automatically identify pixels exhibiting a low fluctuation that is characteristic of resulting from said B0 field drift;
    said processor being further configured to generate, using only said pixels exhibiting said low fluctuation, a body temperature distribution reference representation, selected from the group consisting of a reference phase image and a reference temperature map; and
    said processor being configured to correct at least one of said body temperature distribution representations, or a subsequently-acquired body temperature distribution representation, as a body temperature distribution representation to be corrected, by calibrating respective pixels in said body temperature distribution representation to be corrected with respective pixels corresponding in position in said body temperature distribution reference representation.

* * * * *